(12) United States Patent
Iwanade et al.

(10) Patent No.: US 8,110,736 B2
(45) Date of Patent: Feb. 7, 2012

(54) THERMOELECTRIC ELEMENT DEVICE AND THERMOELECTRIC MODULE

(75) Inventors: Naokazu Iwanade, Tokyo (JP);
Naruhito Kondo, Kanagawa (JP);
Osamu Tsuneoka, Tokyo (JP); Kazuki Tateyama, Kanagawa (JP); Takahiro Sogou, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 612 days.

(21) Appl. No.: 11/466,975

(22) Filed: Aug. 24, 2006

(65) Prior Publication Data

US 2007/0044828 A1    Mar. 1, 2007

(30) Foreign Application Priority Data

Aug. 29, 2005   (JP) ................................ 2005-247915

(51) Int. Cl.
*H01L 35/02* (2006.01)
(52) U.S. Cl. ........ 136/230; 136/201; 136/205; 136/211; 136/212; 257/178; 257/448
(58) Field of Classification Search .................. 136/201, 136/205; 257/178, 448
See application file for complete search history.

(56) References Cited

U.S. PATENT DOCUMENTS

| | | | |
|---|---|---|---|
| 6,347,521 B1 * | 2/2002 | Kadotani et al. ................. 62/3.7 |
| 6,410,840 B1 * | 6/2002 | Sudo et al. .................... 136/201 |
| 6,921,469 B2 * | 7/2005 | Larsen .................... 204/290.12 |
| 2005/0016183 A1 * | 1/2005 | Tateyama et al. ................ 62/3.7 |
| 2006/0118160 A1 | 6/2006 | Funahashi et al. |

FOREIGN PATENT DOCUMENTS

| | | |
|---|---|---|
| DE | 10 2005 030 591 A1 | 1/2006 |
| JP | 10-229224 | 8/1998 |
| JP | 2001-203400 | 7/2001 |
| JP | 2002-246659 | 8/2002 |
| JP | 2002246659 A * | 8/2002 |
| JP | 2002-255561 | 9/2002 |
| JP | 2005-64457 | 3/2005 |
| JP | 2005-116746 | 4/2005 |
| JP | 2005-183528 | 7/2005 |
| JP | 2007-35974 | 2/2007 |

OTHER PUBLICATIONS

German Office Action dated Oct. 6, 2010 in corresponding German Application No. 10 2006 040 283.9-33 (with an English Translation).
Office Action issued Oct. 5, 2010, in Japan Patent Application No. 2005-247915 (with partial English translation).

* cited by examiner

*Primary Examiner* — Basia Ridley
*Assistant Examiner* — Matthew Martin
(74) *Attorney, Agent, or Firm* — Oblon, Spivak, McClelland, Maier & Neustadt, L.L.P.

(57) ABSTRACT

The present invention according to one preferred embodiment provides a thermoelectric element device comprising a first electrode including an electrode member, an elastic member that has electrically conductive and is provided on the electrode member, and a heat uniforming member that has electrically conductive and is provided on the elastic member; a thermoelectric element that is made of a thermoelectric material having thermoelectric effect and arranged on the first electrode so as to contact the heat uniforming member; and a second electrode arranged on the thermoelectric element.

9 Claims, 5 Drawing Sheets

THERMOELECTRIC ELEMENT DEVICE AND THERMOELECTRIC MODULE

CROSS REFERENCE TO RELATED APPLICATION

This application claims the benefit of priority under 35 U.S.C. §119 to Japanese Patent Application No. 2005-247915, filed on Aug. 29, 2005, the entire content of which is incorporated by reference herein.

BACKGROUND OF THE INVENTION

1. Field of the Invention

This invention relates to a thermoelectric element device that directly converts thermal energy to electric energy, or electric energy to thermal energy, and a thermoelectric module composed of such a thermoelectric element device.

2. Description of the Related Art

Generally, a thermoelectric element device is composed of two electrodes opposing each other and a pair of a p-type thermoelectric transducer semiconductor and an n-type thermoelectric transducer semiconductor that are interposed between the two electrodes. In such a device, thermoelectric effect such as the Thomson effect, the Peltier effect and the Seebeck effect is utilized to directly transduce thermal energy to electric energy and conversely. Practically, a thermoelectric module is used which is composed by arranging the thermoelectric element device in parallel.

An example of such a thermoelectric element device or a thermoelectric module is disclosed in Japanese Patent Application Laid-open Publication No. 2005-64457. This publication discloses a thermoelectric transducer apparatus composed of opposingly disposed electrodes, p-type thermoelectric direct transducer semiconductors and n-type thermoelectric direct transducer semiconductors. The semiconductors each are column-shaped and stand together in large numbers between the two electrodes. The semiconductors are soldered to a heat radiation electrode that has in part an elastic meshwork member that abuts the semiconductors slidably.

In the related-art thermoelectric transducer apparatus, since the meshwork member can deform and slide with regard to the semiconductors, a thermal stress due to the difference in coefficient of thermal expansions between a heat-absorbing electrode and the thermoelectric semiconductors is alleviated, thereby avoiding breakage or damage of the thermoelectric transducer apparatus, according to the above publication.

However, since a contact area between the meshwork member and the thermoelectric semiconductor (thermoelectric element) is small, heat may not be evenly distributed in the contact area, which leads to a disadvantage that the thermoelectric transducer apparatus cannot demonstrate an efficiency of thermoelectric conversion up to its inherent capability.

In addition, a corrective measure has not been taken which facilitates to spread the thermal energy from the meshwork member across the surface of the contact area between the thermoelectric semiconductor and the meshwork member. This causes another disadvantage that electromotive force generated in the thermoelectric element cannot be fully utilized when transducing the thermal energy to electric energy.

The present invention has been made in order to eliminate the above disadvantages and the objective thereof lies in a provision of a thermoelectric element device which alleviates a thermal stress in the thermoelectric element device and evenly distributes heat on the surface of the thermoelectric element, the surface meeting the electrode thereof, thereby improving a performance and thermoelectric conversion efficiency of the thermoelectric element device, and a thermoelectric module employing such a thermoelectric element device.

A first aspect of the present invention provides a thermoelectric element device comprising a first electrode including an electrode member, an elastic member being electrically conductive and being provided on the electrode member, and a heat uniforming member being electrically conductive and being provided on the elastic member; a thermoelectric element being made of a material having thermoelectric effect and being arranged on the first electrode so as to contact the heat uniforming member; and a second electrode being arranged on the thermoelectric element.

In addition, it is preferable in the thermoelectric element that the second electrode includes an electrode member, an elastic member being electrically conductive and being provided on the electrode member, and a heat uniforming member being electrically conductive and being provided on the elastic member; and that the thermoelectric element is arranged on the second electrode so as to contact the heat uniforming member.

Moreover, elasticity of the elastic member is preferably larger than the elasticity of the thermoelectric element and is equal to or larger than the elasticity of the first electrode in the above thermoelectric element. Furthermore, the heat uniforming member has preferably a thermal conductivity larger than that of the thermoelectric element.

The heat uniforming member has preferably a thermal conductivity larger than that of the thermoelectric element.

The heat uniforming member is preferably made of any chemical element of iron, nickel, tantalum, titanium, tungsten, copper, and carbon; a substance containing any one of the chemical elements as a primary constituent; an alloy, compound, or mixture of two or more of the chemical elements and the substances; and a member obtained by joining two or more of the chemical elements, the substance, the alloy, the compound, and the mixture.

More preferably, the thermoelectric element comprises a pair of thermoelectric elements including an n-type conduction portion and a p-type conduction portion that are separated apart from each other; and either one of the first electrode and the second electrode includes a first portion arranged on the n-type conduction portion and a second portion arranged on the p-type conduction portion, the first and second portion being separated apart from each other.

A second aspect of the present invention provides a thermoelectric module comprising a plurality of thermoelectric element devices that each are arranged so as to be electrically connected to an adjoining thermoelectric element device. Each of the thermoelectric element devices is any one of the aforementioned ones.

According to the present invention applied to the thermoelectric element device and the thermoelectric module employing the same, there can be alleviated a thermal stress caused in the thermoelectric element device by the elastic member; and there can be evenly distributed an in-plane temperature of the thermoelectric element since the thermoelectric element is provided with the heat uniforming member configured to evenly distribute the thermal energy incoming from the elastic member two-dimensionally in the thermoelectric member, thereby improving the thermoelectric conversion efficiency of the thermoelectric element device and the thermoelectric module employing the same.

DESCRIPTION OF THE PREFERRED EMBODIMENT

Referring to accompanying drawings, preferred embodiments of the present invention will be described in detail hereinafter. In the drawings, like or similar numerals are given to like or similar members. Additionally, the accompanying drawings show a thermoelectric element device and a thermoelectric module employing the same for illustrative purpose only. Therefore, it should be noted that the accompanying drawings are not to scale but are to merely outline the embodiments and are not intended to portray the specific parameters or the structural details of the embodiments.

A First Embodiment

Figure 1:
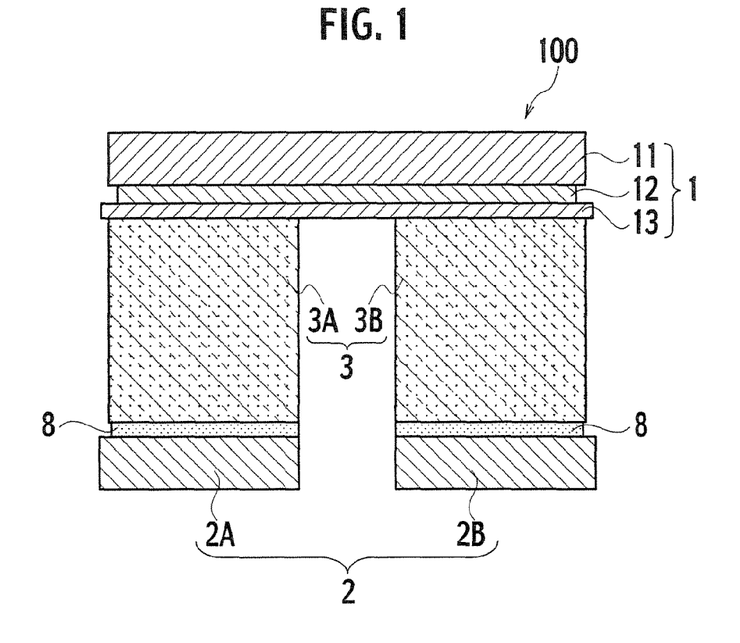
FIG. 1 is a schematic view of a thermoelectric element device according to a first embodiment of the present invention.

FIG. 1 is a schematic view of a thermoelectric element device according to a first embodiment of the present invention. As shown, a thermoelectric element device 100 has a first electrode 1, a thermoelectric element 3, and a second electrode 2.

The first electrode 1 is composed of an electrode member 11, an elastic member 12 provided so as to abut the reverse surface of the electrode member 11, and a heat uniforming member 13 provided so as to abut the elastic member 12.

The elastic member 12 is electrically conductive and thus constitutes a part of the first electrode 1. The elastic member 12 has a predetermined elasticity and is preferably deformed more easily than the thermoelectric element 3. Specifically, the elasticity member 12 has usefully a grid-like pattern of mesh, lattice, honeycomb, or the like. In this embodiment, there is employed the elastic member 12 composed of woven wires such as a fine metal wire mesh or the like.

By the way, while elasticity inherent to a material that composes the elastic member 12 is preferably higher than that of the materials that constitute the thermoelectric element 3 and the electrode member 11, this is not always the case. For example, the elastic member 12 may become more elastic than the thermoelectric element 3 and equally or more elastic than the electrode member 11 by forming the elastic member 12 into the aforementioned shape, irrespective of the inherent elasticity of the material.

Additionally, the elastic member 12 is bonded to the electrode member 11 by diffusion-bonding in this embodiment.

The heat uniforming member 13 is electrically conductive and thus constitutes a part of the first electrode 1. The heat uniforming member 13 is preferably composed so as to be more thermally conductive than the thermoelectric element 3. Specifically, the heat uniforming member 13 is composed of a thin plate material such as a metal foil or the like. More specifically, the heat uniforming member 13 is preferably composed of a thin plate of iron, nickel, tantalum, titanium, tungsten, copper, or carbon, which are relatively inexpensive and highly thermally conductive. Moreover, the heat uniforming member 13 can be composed using a substance having either one of these metals as a primary constituent, an alloy, compound, or mixture composed of the substance and/or two or more of the above metals. Furthermore, the heat uniforming member 13 may be composed of a thin plate composed by attaching two or more of the metals, the material, the alloy and the like. In this case, a side of the heat uniforming member 13, the side meeting the elastic member 12, is preferably made of the same substance as that constitutes the elastic member 12.

The heat uniforming member 13 has preferably a higher thermal conductivity than that of the elastic member 12 as a whole. In order to allow the heat uniforming member 13 to have a higher thermal conductivity thin the elastic member 12, a thermal conductivity inherent to the material that composes the heat uniforming member 13 is preferably higher than that constitutes the elastic member 12, but this is not always the case. Irrespective of a thermal conductivity of the material per se, when the heat uniforming member 13 becomes more thermally conductive than the elastic member 12 because the heat uniforming member 13 is formed into a shape of plate, sheet or the like whereas the elastic member 12 is formed into a shape of mesh or the like, the heat uniforming member 13 can resultantly have a higher thermal conductivity.

Additionally, the heat uniforming member 13 is contacted or diffusion-bonded to the elastic member 12.

The thermoelectric element 3 is composed of a pair of a first portion 3A (referred to as a thermoelectric element 3A, as the case may be hereinafter) and a second portion 3B (referred to as a thermoelectric element 3B, as the case may be hereinafter) which are separated apart from each other, as shown in FIG. 1.

The thermoelectric elements 3A, 3B are composed of a thermoelectric material having a thermoelectric effect such as the Peltier effect, the Seebeck effect, or the Thomson effect. As a typical substance having such effects, there are the following substances as a thermoelectric semiconductor: a substance having as a primary constituent a compound of bismuth and tellurium, a substance having as a primary constituent a compound of bismuth and stibium, a substance having as a primary phase a filled Skutterudite structure in which voids in a $CoSb_3$ group compound crystal having a Skutterudite crystal structure are filled by a chemical element, a substance having as a primary phase a Halfheusler compound with MgAgAs type crystal structure, and a clathrate compound containing barium and gallium. In addition, a mixture of any two or more of these substances can be used to compose the thermoelectric element 3. Moreover, a member obtained by joining a material composed of each substance above, the mixture of any two or more of these substances, a compound of any two or more of these substances may also be used to make the thermoelectric element 3. These substances or the like have relatively low thermal conductivity. Therefore, when the thermoelectric elements 3A, 3B are composed of these substances or the like, a thermal gradient is easily maintained in the thermoelectric elements 3A, 3B, thereby improving a performance of the thermoelectric element device.

Additionally, these thermoelectric semiconductors have two conductive types: n-type conductivity and p-type conductivity. As in this embodiment, when the thermoelectric element 3 is composed of a pair of the thermoelectric element 3A and the thermoelectric element 3B, it is typical that one of the pair is n-type and the other is p-type.

The thermoelectric elements 3A, 3B are arranged so that they contact, but are not bonded or adhered to, the heat uniforming member 13 of the first electrode 1. Namely, the thermoelectric elements 3A, 3B merely stay in contact with the heat uniforming member 13.

The second electrode 2 is composed of a first portion 2A (referred to as a second electrode 2A, as the case may be hereinafter) disposed so as to contact the thermoelectric element 3A, and a second portion 2B (referred to as a second electrode 2B, as the case may be hereinafter) disposed so as to contact the thermoelectric element 3B, corresponding to the thermoelectric element 3 composed of two portions. In this embodiment, by use of a bonding member 8 such as a solder, the second electrode 2A is joined to the thermoelectric element 3A and the second electrode 2B is joined to the thermoelectric element 3B.

By the way, since FIG. 1 illustrates where the first electrode 1 is arranged aloft for the convenience of explanation, the elastic member 12 is provided on the lower face of the first electrode 11. However, if the thermoelectric element device shown in FIG. 1 is turned upside down, it is apparent that the elastic member 12 is provided above the electric member 11 and the heat uniforming member 13 is provided above the elastic member 12. Furthermore, it is also apparent that the thermoelectric elements 3A, 3B are disposed above the first electrode 1.

According to the above configuration, when a direct voltage is applied across the second electrodes 2A, 2B so as to flow a direct current thereacross, either the first electrode 1 or the second electrode 2 serves as a heat radiation surface and the other serves as a heat absorption surface. Therefore, by adjusting the current, the thermoelectric element device 100 operates as a temperature controller. In addition, the thermoelectric element device 100 is capable of operating as temperature measurement equipment. Namely, since a voltage is generated across the first electrode 1 and the second electrodes 2A, 2B in accordance with a temperature difference therebetween, the temperature can be measured through the voltage.

As stated above, when the thermoelectric element device 100 is operating, there is caused an uneven distribution of temperature, which produces a thermal stress due to the difference in coefficient of thermal expansions in the thermoelectric element device 100.

However, in this embodiment, since the elastic member 12 is composed of woven wires such as a fine metal wire mesh and thus has an elasticity higher than that of the thermoelectric element 3 and equal to or higher than that of the electrode member 11, the thermal stress can be alleviated. In other words, the elastic member 12 serves to alleviate the thermal stress due to a thermal coefficient difference between the electrode member 11 and the thermoelectric elements 3A, 3B. Therefore, problems such as breakage that may cause in the thermoelectric element device 100 due to the thermal stress and a deterioration of the thermoelectric elements 3A, 3B will be eliminated. By the way, since the heat uniforming member 13 merely contacts the thermoelectric element 3 so that the heat uniforming member 13 and the thermoelectric element 3 can shift slide from each other, the heat stress is alleviated to a greater degree.

The heat uniforming member 13 is bonded or contacted to the elastic member 12 and contacted to the thermoelectric element 3. In addition, the heat uniforming member 13 is more thermally conductive than both the elastic member 12 and the thermoelectric element 3. Therefore, the heat uniforming member 13 is able to evenly spread the thermal energy incoming from the elastic member 12 two-dimensionally across the heat uniforming member 13 per se and then to transmit evenly the heat to the thermoelectric element 3.

If the elastic member 12 could directly contact the thermoelectric elements 3A, 3B, a substantive contact area would become smaller between the thermoelectric elements 3A, 3B and the elastic member 12 that has a grid-like pattern of mesh or the like for maintaining its elasticity, which may cause problems of hindered heat conduction or deteriorated thermal uniformity. However, the thermoelectric element device 100 can improve a thermal uniformity in the contact area between the elastic member 12 and the thermoelectric elements 3A, 3B due to the heat uniforming member 13 excellent in thermal conductivity, thereby improving a thermoelectric transducer efficiency.

By the way, although the first embodiment exemplifies where the thermoelectric element 3 is composed of a pair of the first portion 3A and the second portion 3B, the thermoelectric element 3 may be composed of a unitary piece using a thermoelectric material and accordingly the second electrode may be composed of a unitary piece. Such a configuration can operate as the thermoelectric element device and has no difference in the other components, thereby exhibiting the aforementioned effect.

A Second Embodiment

Figure 2:
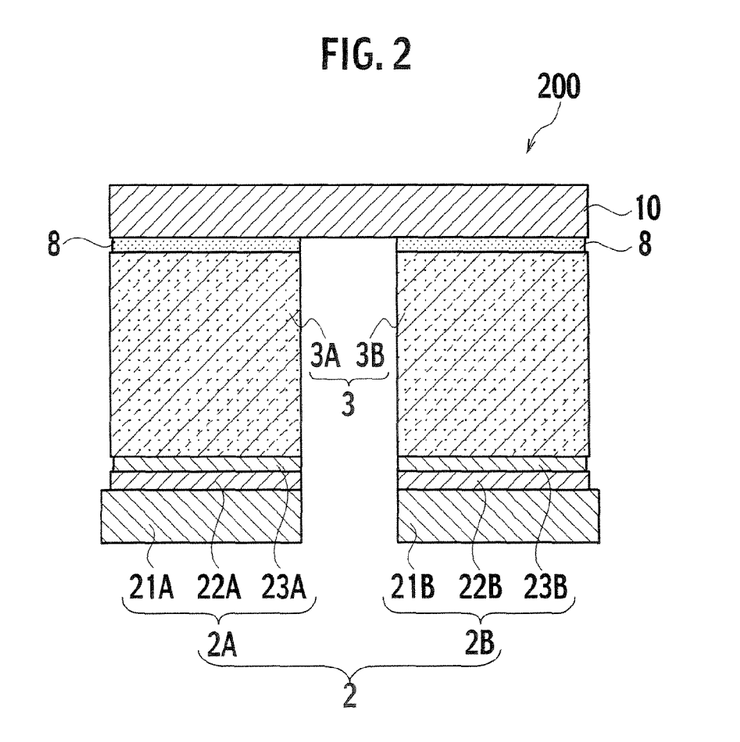
FIG. 2 is a schematic view of a thermoelectric element device according to a second embodiment of the present invention.

FIG. 2 is a schematic view of a thermoelectric element device according to a second embodiment of the present invention. As shown, a thermoelectric element device 200 according to the second embodiment is composed of a first electrode 10, a thermoelectric element 3, and a second electrode 2.

The second electrode 2 is composed of a first portion 2A (referred to as a second electrode 2A, as the case may be hereinafter) and a second portion 2B (referred to as a second electrode 2B, as the case may be hereinafter), both of which are separated apart from each other. Specifically, the second electrode 2A is composed by arranging an elastic member 22A and an uniforming member 23A in this order on an electrode member 21A. Similarly, the second electrode 2B is composed by arranging an elastic member 22B and an uniforming member 23B in this order on an electrode member 21B.

The electrode members 21A, 21B, the elastic members 22A, 22B, and the uniforming members 23A, 23B are formed of the same material as those used for the electrode member 11, the elastic member 12, and the uniforming member 13 in the first embodiment, respectively. In addition, the electrode materials 21A, 21B are contacted or bonded by diffusion-bonding to the elastic members 22A, 22B. Moreover, the elastic members 22A, 22B are contacted or bonded by diffusion-bonding to the uniforming member 23A, 23B, respectively.

The thermoelectric element 3 is formed of materials cited in the first embodiment and composed of a pair of a first portion 3A (a thermoelectric element 3A) and a second portion 3B (a thermoelectric element 3B). In this case, either one of the thermoelectric elements 3A, 3B has p-type conduction and the other has n-type conduction. The thermoelectric element 3A is arranged on the second electrode 2A so as to contact the uniforming member 23A; and the thermoelectric element 3B is arranged on the second electrode 2B so as to contact the uniforming member 23B. The thermoelectric elements 3A, 3B are not bonded or adhered to but remain contacted to the uniforming member 23A, 23B, respectively, as is the case with the thermoelectric element 3 and the uniforming member 12 in the first embodiment. To the first electrode 10 is joined the thermoelectric element 3 by use of a bonding material 8.

As stated above, instead of the first electrode 1 composed of the first electrode member 11, the elastic member 12 and the uniforming member 13 in the first embodiment, it is the second electrode 2 that is composed of these members; and the thermoelectric element contacts the uniforming member, in the thermoelectric element device 200. Due to such a configuration, the thermoelectric element device 200 exhibits the same effect as the thermoelectric element device 100 according to the first embodiment.

A Third Embodiment

Figure 3:
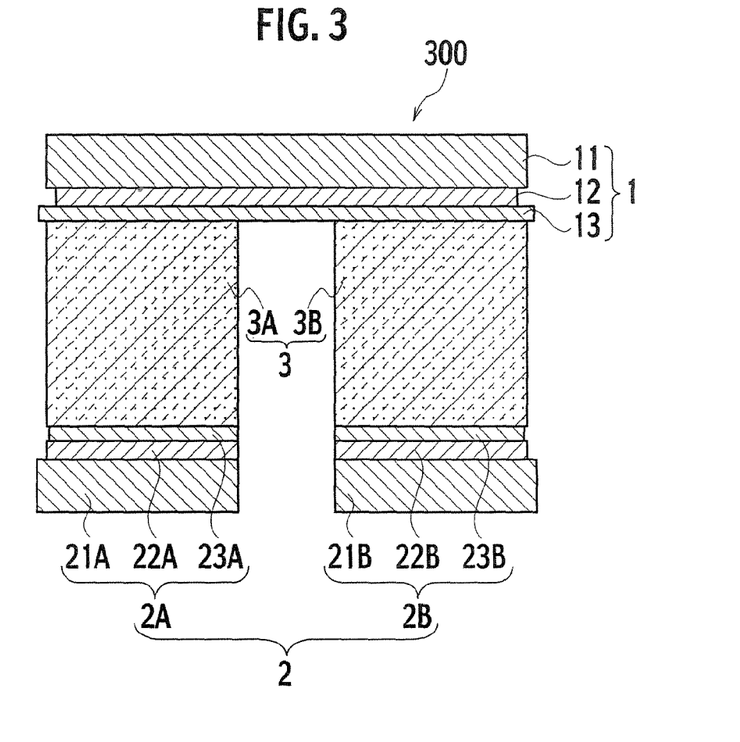
FIG. 3 is a schematic view of a thermoelectric element device according to a third embodiment of the present invention.

FIG. 3 is a schematic view of a thermoelectric element device 300 according to a third embodiment of the present invention. As shown, a first electrode 1 is composed of an electrode member 11, an elastic member 12 provided so as to contact a lower surface of the electrode member 11, a uniforming member 13 provided so as to contact the elastic member 12. A second electrode 2 is composed of a pair of second electrodes 2A, 2B, both of which are separated apart from each other. In the second electrode 2A, there are arranged an elastic member 22A and a uniforming member 23A in this order on an electrode member 21A; and in the second electrode member 2B there are arranged an elastic member 22B and a uniforming member 23B in this order on an electrode member 21B.

The elastic members 12, 22A, 22B are contacted or bonded for example by diffusion-bonding with respect to the corresponding electrode members 11, 21A, 21B. In addition, the uniforming members 13, 23A, 23B are contacted or bonded for example by diffusion-bonding with respect to the corresponding elastic members 12, 22A, 22B.

The thermoelectric element 3 is made of the same material as those used for the thermoelectric element in the first and the second embodiment; and composed of a p-n pair of a first portion 3A (a thermoelectric element 3A) and a second portion 3B (a thermoelectric element 3B). The thermoelectric element 3A is arranged on the second electrode 2A so as to contact the uniforming member 23A; and the thermoelectric element 3B is arranged on the second electrode 2B so as to contact the uniforming member 23B. Moreover, the first electrode 1 is arranged on the thermoelectric elements 3A, 3B so that the heat uniforming member 13 constituting the first electrode 1 meets thermoelectric elements 3A, 3B. The thermoelectric elements 3A, 3B are not bonded or adhered to but remain contacted to the uniforming members 13, 23A, 23B.

As stated above in the thermoelectric element device 300, both the first electrode 1 and the second electrode 2 are composed of the electrode member, the elastic member and the heat uniforming member; and the upper and the lower surface of the thermoelectric element 3 contact the uniforming member. Therefore, thermal stress caused from the difference in coefficient of thermal expansions is alleviated at the upper and lower surface thereof and thermal uniformity is improved, thereby providing higher thermoelectric conversion efficiency.

A Fourth Embodiment

Figure 4:
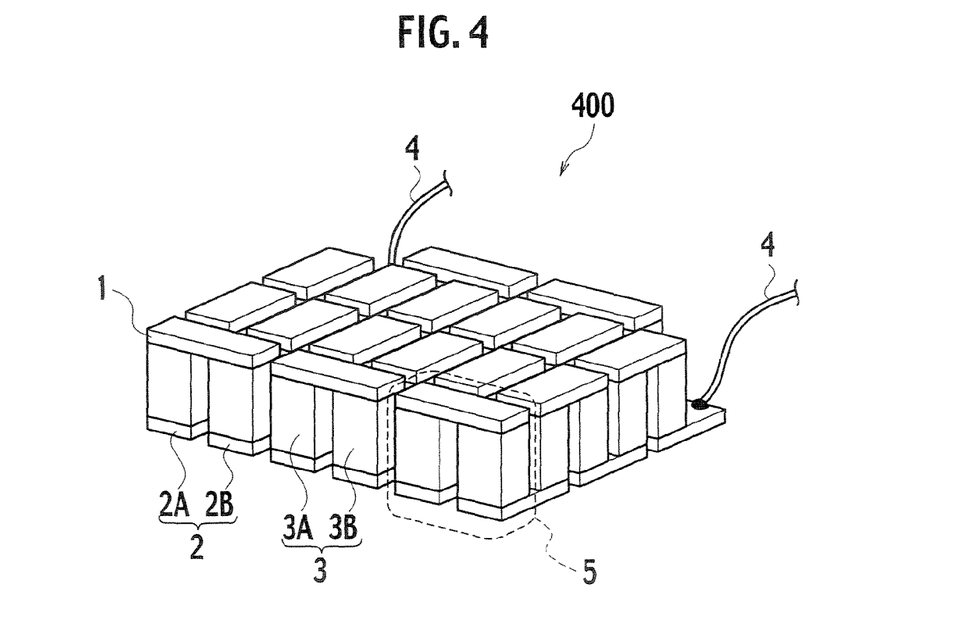
FIG. 4 is a schematic view of a thermoelectric element device according to a fourth embodiment of the present invention.

FIG. 4 is a schematic view of a thermoelectric module according to a fourth embodiment of the present invention. As shown, a thermoelectric module 400 is composed by two-dimensionally arranging a plurality of thermoelectric element devices 5. Each thermoelectric element device 5 is composed of a first electrode 1, a second electrode 2, and a thermoelectric element 3 that is arranged so as to be electrically and thermally connected with the first electrode 1 and the second electrode 2. The first electrode 1 and/or the second electrode 2 are composed of an electrode member, an elastic member arranged on the electrode member, and a uniforming member arranged on the elastic member. Although FIG. 4 illustrates where the thermoelectric element device 5 is the same as the thermoelectric element device 100 according to the first embodiment, the thermoelectric element device 5 may be the thermoelectric element devices 200, 300 according to the second and the third embodiment, respectively.

In addition, an electric energy transfer from/to the thermoelectric module 400 to/from an external circuit is carried out through two wires 4 that are provided so as to be connected with the second electrode 2. As apparent from FIG. 4, each thermoelectric element device 5 is arranged in series with one another between the wires 4, 4. Therefore, when a direct voltage is applied across the wires 4, 4, an electric current flows through the second electrode 2, the thermoelectric element 3B, the first electrode 1, the thermoelectric element 3A, the second electrode 2, the thermoelectric element 3B, . . . . In this case, either one of the first electrode 1 and the second electrode 2 serves as a heat radiation surface; and the other serves as a heat absorption surface.

As above in the thermoelectric module 400 as described, the first electrode 1 and/or the second electrode 2 are composed of the electrode member, the elastic member arranged on the electrode member, and the uniforming member arranged on the elastic member; and the thermoelectric element 3 contacts the uniforming member. Therefore, thermal stress caused from the difference in coefficient of thermal expansions is alleviated due to the elastic member and thermal uniformity is improved due to the heat uniforming member, thereby providing the thermoelectric module with improved thermoelectric conversion efficiency.

The present invention has been described in detail with reference to preferred embodiments that are intended for purposes of illustration only and are not intended to limit the scope of the invention. For example, when the elastic member is diffusion-bonded to the electrode member, and the uniforming member is diffusion-bonded to the elastic member, the bonding may be conducted using a brazing material having silver as a primary constituent, a brazing material having titanium as a primary constituent, a brazing material having copper as a primary constituent, a brazing material having palladium as a primary constituent, a brazing material having nickel as a primary constituent, a brazing material containing aluminum, a brazing material containing magnesium, a solder containing bismuth, and a lead-free solder, instead of diffusion-bonding. Moreover, the bonding is not limited to the above, as far as an electrical and thermal connection is not deteriorated.

Although the first and the second embodiment exemplify a solder as the bonding material 8, the bonding material is not limited to the solder, as far as a bonding quality is not deteriorated at a working temperature of the thermoelectric element device. For example, the bonding material 8 may be a conductive adhesive or a brazing material such as a silver wax or the like.

Moreover, although the grid-like patterns of mesh, lattice, or honeycomb have been exemplified as the shape of the elastic member, it is apparent from the above explanation that the shape is not limited to these patterns. Needless to say, even a plate shape can exhibit the same effect as the elastic member.

Figure 5A:
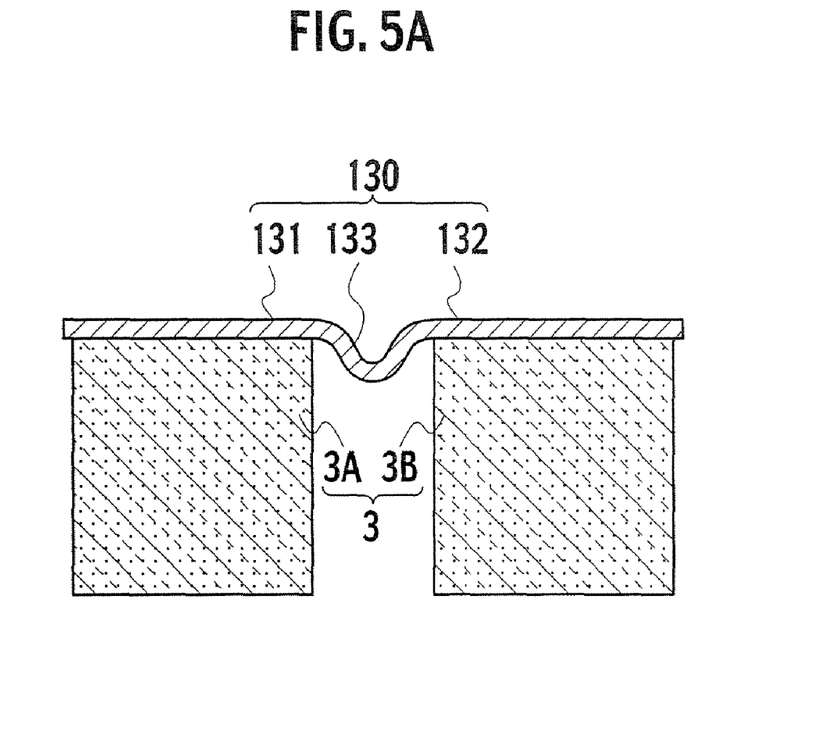
FIG. 5A illustrates an example of a modified uniforming member.
Figure 5B:
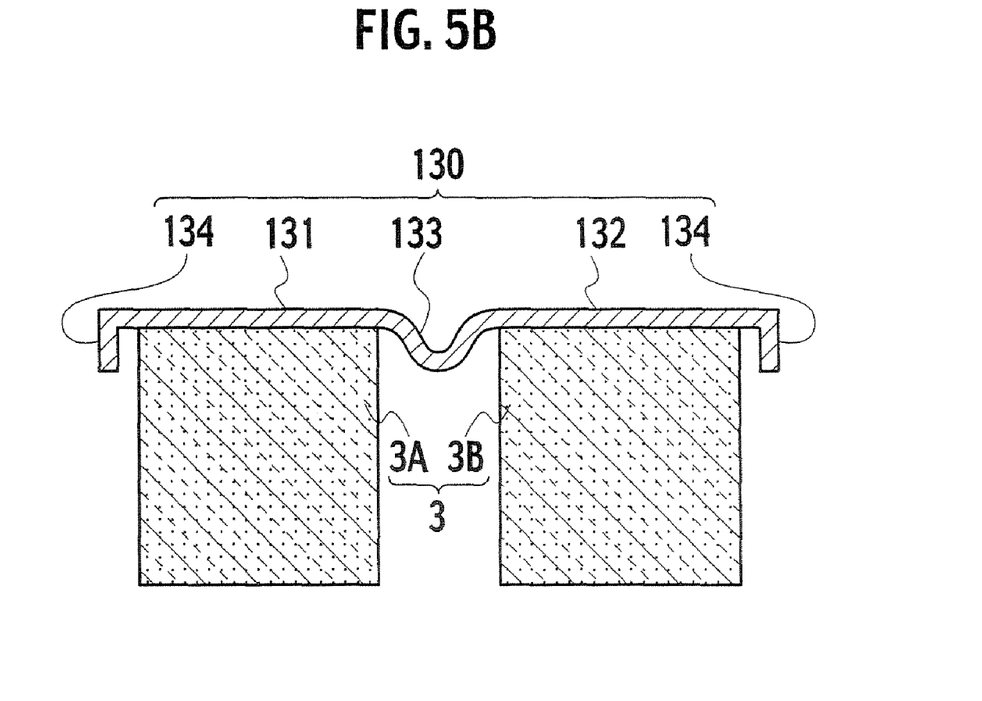
FIG. 5B illustrates an example of a another modified uniforming member.
Figure 6A:
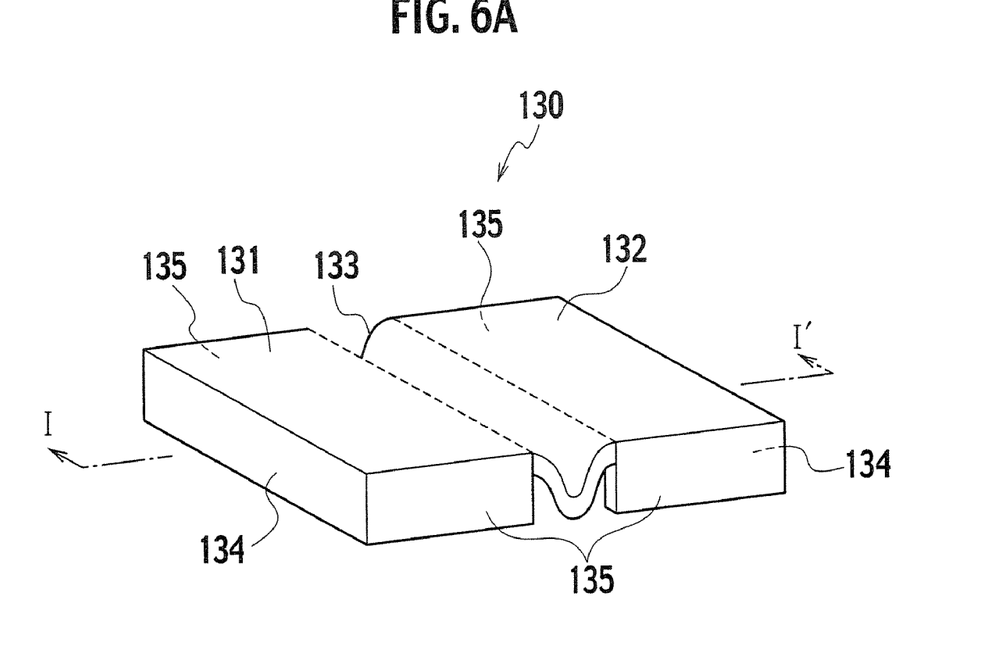
FIG. 6A is a perspective view of an example of a yet another modified uniforming member.
Figure 6B:
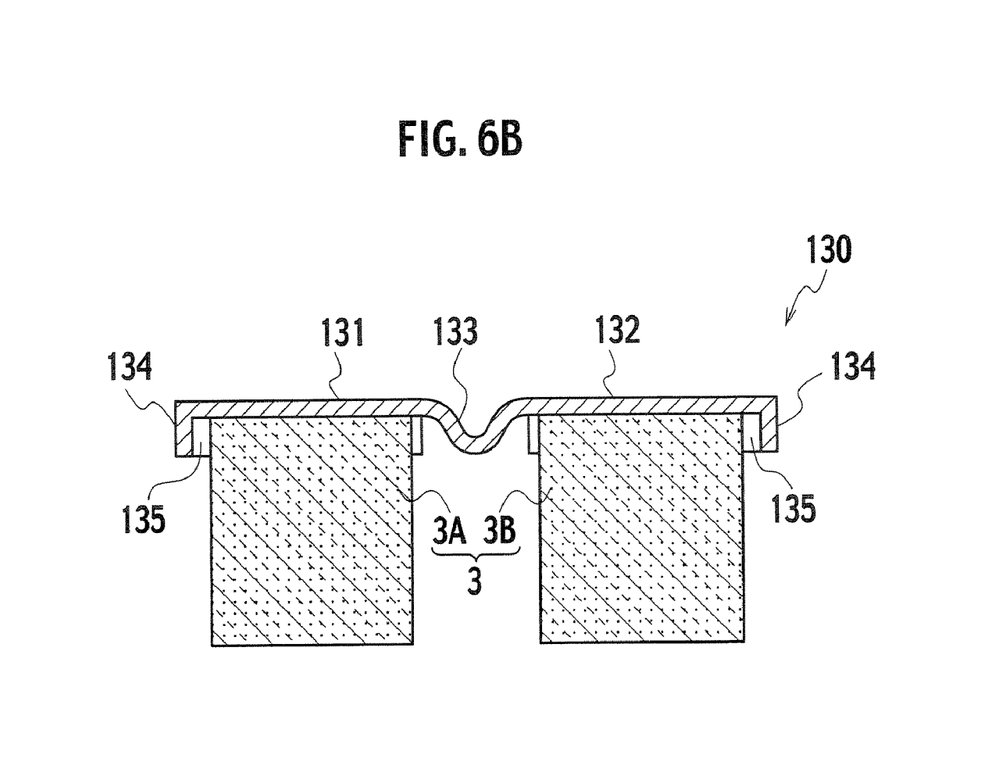
FIG. 6B is a cross-sectional view taken along I-I' line in FIG. 6A.

Although the plate-shape has been exemplified as a shape of the uniforming member, the uniforming member may have a shape illustrated in FIGS. 5 and 6, as far as only the contact area thereof with the thermoelectric element is plate-shaped. Namely, as shown in FIG. 5A, the uniforming member 130 can have a first plate portion 131 that contacts the thermoelectric element 3A, a second plate portion 132 that contacts the thermoelectric element 3B, and a bending portion 133 that is provided between the first plate portion 131 and the second plate portion 132. Such a shape can also spread evenly the heat from the elastic member (not shown in FIGS. 5 and 6) thereby to transmit the heat to the thermoelectric element 3, as is the case with the uniforming members in the first through the fourth embodiment. In addition, the bending portion 133 is formed deformable, thereby assisting in the alleviation of the thermal stress. By the way, although the bending portion 133 has a U-shape in FIG. 5A, the shape of the bending portion 133 is not limited to the U-shape. For example, the bending portion 133 can be V-shaped or W-shaped.

Additionally, the first plate portion 131 and the second plate portion 132 may have a dangling portion 134 that extends downward along an edge opposing the edge provided with the bending portion 133, as shown in FIG. 5B. Moreover, an additional dangling portion 135 can be provided on each of two edges adjacent to the edge provided with the dangling portion 134, as shown in FIGS. 6A and 6B.

Figure 7A:
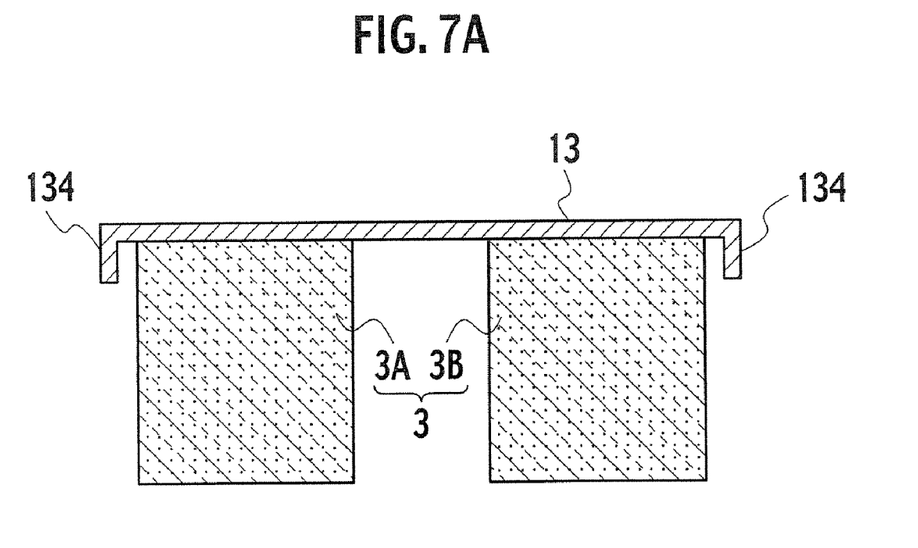
FIG. 7A illustrates an example of a yet another, another modified uniforming member.
Figure 7B:
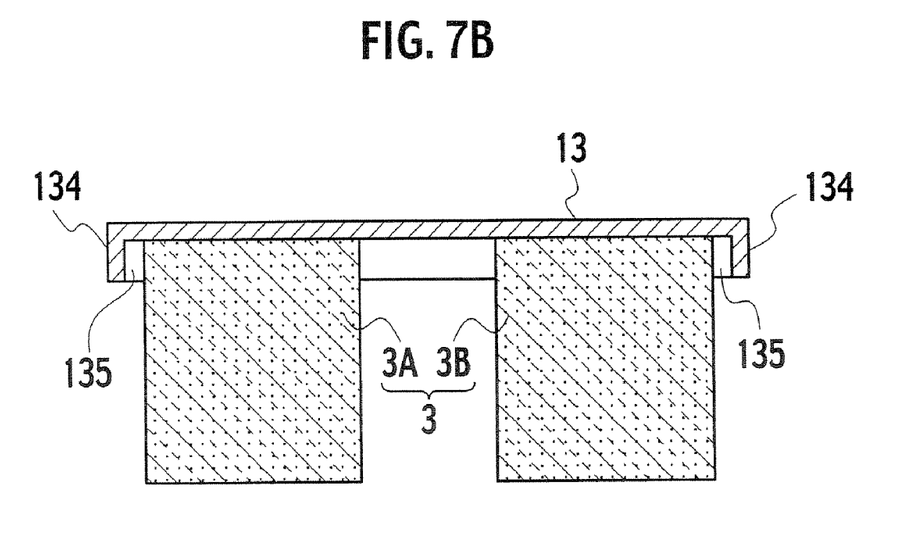
FIG. 7B illustrates another example of another modified uniforming member.

Furthermore, the dangling portion 134 may be provided to the plate-shaped uniforming member 13 shown in FIG. 1 and FIG. 3, as shown in FIG. 7A; and both the dangling portion 134 and the dangling portion 135 may be provided to the plate-shaped uniforming member 13 in FIG. 1 and FIG. 3, as shown in FIG. 7B. Additionally, only the dangling portion 135 can be provided thereto.

Although FIG. 4 illustrates the thermoelectric module composed of 17 thermoelectric element devices, it goes without saying that the number of the thermoelectric element devices that are employed in the thermoelectric module is not limited to 17. In addition, a layout of each thermoelectric element device is not limited to the illustrated one.

By the way, although the fourth embodiment exemplifies the thermoelectric module that has two-dimensionally arranged thermoelectric element devices composed of a pair of the n-type conduction portion and the p-type conduction portion, the thermoelectric module may be composed of a thermoelectric element device having a unitary piece thermoelectric element. Namely, in such a thermoelectric element device, the thermoelectric element is composed of either an n-type conduction portion or a p-type conduction portion; and accordingly the first electrode 1 and the second electrode 2 are composed of a unitary piece. When the thermoelectric module is composed of the thermoelectric element devices having such a configuration, it would be understood by those skilled in the art that a plurality of the thermoelectric element devices are arranged in parallel with one another. In addition, the thermoelectric module having such a configuration can apparently alleviate the thermal stress and improve the thermoelectric conversion efficiency since the first electrode and/or the second electrode are composed of the electrode member, elastic member, and the uniforming member in each thermoelectric element device.

What is claimed is:

1. A thermoelectric element device comprising:
    a first electrode comprising:
        an electrode member,
        an elastic member being electrically conductive and provided on the electrode member, the elastic member having a grid-like pattern of mesh, lattice, or honeycomb, and
        a heat uniforming member being electrically conductive and provided on the elastic member;
    a thermoelectric element:
        made of a material having thermoelectric effect,
        arranged on the first electrode, and
        conductively contacting, without a bonding, the heat uniforming member along an entire surface of the thermoelectric element, to be slidable on the heat uniforming member; and
    a second electrode arranged on the thermoelectric element,
    wherein elasticity of the elastic member is larger than the elasticity of the thermoelectric element and is equal to or larger than the elasticity of the first electrode.

2. A thermoelectric element device as recited in claim 1, wherein the second electrode includes:
    a second electrode member,
    a second elastic member being electrically conductive and provided on the second electrode member the second elastic member having a grid-like pattern of mesh, lattice, or honeycomb, and
    a second heat uniforming member electrically conductive and provided on the second elastic member; and
    wherein the thermoelectric element is arranged on the second electrode so as to be conductively contacting on the second heat uniforming member,
    wherein elasticity of the second elastic member is larger than the elasticity of the thermoelectric element and is equal to or larger than the elasticity of the first electrode.

3. A thermoelectric element device as recited in claim 1, wherein thermal conductivity of the heat uniforming member is larger than the thermal conductivity of the thermoelectric element.

4. A thermoelectric element device as recited in claim 2, wherein thermal conductivity of the second heat uniforming member is larger than the thermal conductivity of the thermoelectric element.

5. A thermoelectric element device as recited in claim 1, wherein the heat uniforming member is made of:
    (a) any chemical element of iron, nickel, tantalum, titanium, tungsten, copper, and carbon;
    (b) a substance containing any one of the chemical elements as a primary constituent;
    (c) an alloy of two or more of the chemical elements and the substance;
    (d) a compound of two or more of the chemical elements and the substance;
    (e) a mixture of two or more of the chemical elements and the substance; or
    (f) a member obtained by joining two or more of the chemical elements, the substance, the alloy, the compound, and the mixture.

6. A thermoelectric element device as recited in claim 2, wherein the second heat uniforming member is made of:

(a) any chemical element of iron, nickel, tantalum, titanium, tungsten, copper, and carbon;
(b) a substance containing any one of the chemical elements as a primary constituent;
(c) an alloy of two or more of the chemical elements and the substance;
(d) a compound of two or more of the chemical elements and the substance;
(e) a mixture of two or more of the chemical elements and the substance; or
(f) a member obtained by joining two or more of the chemical elements, the substance, the alloy, the compound, and the mixture.

7. A thermoelectric element device as recited in claim 1, wherein the material having the thermoelectric effect comprises:
(a) a substance having as a primary phase a compound of bismuth and tellurium;
(b) a substance having as a primary phase a compound of bismuth and antimony;
(c) a substance having as a primary phase a filled Skutterudite structure in which voids in a $CoSb_3$ group compound crystal having a skutterudite crystal structure are filled;
(d) a substance having as a primary phase a Halfheusler compound with a MgAgAs type crystal structure;
(e) a clathrate compound containing barium and gallium;
(f) a mixture of the substances or the compounds; or
(g) a material composed by joining the substances, the compounds, or the mixture.

8. A thermoelectric element device as recited in claim 1,
wherein the thermoelectric element comprises a pair of thermoelectric elements including an n-type conduction portion and a p-type conduction portion that are separated apart from each other; and
wherein either one of the first electrode and the second electrode includes a first portion arranged on the n-type conduction portion and a second portion arranged on the p-type conduction portion, the first and second portion of the electrode separated apart from each other.

9. A thermoelectric module comprising:
a plurality of thermoelectric element devices that each are arranged so as to be electrically connected to an adjoining thermoelectric element device, each of the thermoelectric element devices recited in claim 1.

\* \* \* \* \*